(12) United States Patent
Chen et al.

(10) Patent No.: US 7,838,200 B2
(45) Date of Patent: Nov. 23, 2010

(54) PHOTORESIST COMPOSITIONS AND METHOD FOR MULTIPLE EXPOSURES WITH MULTIPLE LAYER RESIST SYSTEMS

(75) Inventors: Kuang-Jung Chen, Poughkeepsie, NY (US); Wu-Song Huang, Brewster, NY (US); Wai-kin Li, Beacon, NY (US); Pushkara R. Varanasi, Poughkeepsie, NY (US); Sen Liu, Piscataway, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/356,187

(22) Filed: Jan. 20, 2009

(65) Prior Publication Data
US 2009/0155715 A1    Jun. 18, 2009

Related U.S. Application Data

(63) Continuation-in-part of application No. 11/955,451, filed on Dec. 13, 2007.

(51) Int. Cl.
*G03F 7/00* (2006.01)
*G03F 7/004* (2006.01)
*G03F 7/20* (2006.01)
*G03F 7/26* (2006.01)
*G03F 7/40* (2006.01)

(52) U.S. Cl. ............... 430/270.1; 430/273.1; 430/312; 430/394; 430/330

(58) Field of Classification Search ........... 430/270.1, 430/273.1, 312, 330, 394, 913
See application file for complete search history.

(56) References Cited

U.S. PATENT DOCUMENTS 5,576,143 A    11/1996    Aoai et al.

(Continued)

FOREIGN PATENT DOCUMENTS

EP    0532183    3/1993

(Continued)

OTHER PUBLICATIONS

Lee, et al.;Photolithographic Micropatterning of an Electroluminescent Polymer Using Photobase Generator: 2003 American Chemical Society; Macromolecules 2003, vol. 36, No. 24; pp. 9252-9256.

*Primary Examiner*—Amanda C. Walke
(74) *Attorney, Agent, or Firm*—Schmeiser, Olsen & Watts; Joseph Abate

(57) ABSTRACT

A method and a resist composition. The resist composition includes a polymer having repeating units having a lactone moiety, a thermal base generator capable of generating a base and a photosensitive acid generator. The polymer has the properties of being substantially soluble in a first solvent and becoming substantially insoluble after heating the polymer. The method includes forming a film of a photoresist including a polymer, a thermal base generator capable of releasing a base, a photosensitive acid generator, and a solvent. The film is patternwise imaged. The imaging includes exposing the film to radiation, resulting in producing an acid catalyst. The film is developed in an aqueous base, resulting in removing base-soluble regions and forming a patterned layer. The patterned layer is baked above the temperature, resulting in the thermal base generator releasing a base within the patterned layer and the patterned layer becoming insoluble in the solvent.

23 Claims, 4 Drawing Sheets

U.S. PATENT DOCUMENTS

| | | |
|---|---|---|
| 5,650,261 A | 7/1997 | Winkle |
| 5,932,391 A | 8/1999 | Ushirogouchi et al. |
| 6,051,625 A | 4/2000 | Harkness et al. |
| 6,171,756 B1 * | 1/2001 | Cristiano et al. .......... 430/270.1 |
| 6,177,360 B1 | 1/2001 | Carter et al. |
| 6,541,597 B2 | 4/2003 | Okino et al. |
| 6,746,827 B2 | 6/2004 | Richter et al. |
| 6,969,577 B2 * | 11/2005 | Adegawa ................. 430/270.1 |
| 6,991,893 B2 * | 1/2006 | Goodner et al. ............. 430/322 |
| 2002/0160315 A1 | 10/2002 | Richter et al. |
| 2006/0127816 A1 * | 6/2006 | Kang et al. ................. 430/312 |
| 2006/0160028 A1 * | 7/2006 | Lee et al. .................... 430/312 |

FOREIGN PATENT DOCUMENTS

| | | |
|---|---|---|
| EP | 926555 A1 * | 6/1999 |
| EP | 1522891 | 4/2005 |
| JP | 2005017354 A * | 1/2005 |

* cited by examiner

PHOTORESIST COMPOSITIONS AND METHOD FOR MULTIPLE EXPOSURES WITH MULTIPLE LAYER RESIST SYSTEMS

CROSS-REFERENCE TO RELATED APPLICATIONS

The present application is a Continuation-In-Part (CIP) application of U.S. patent application Ser. No. 11/955,451 filed on Dec. 13, 2007 with the United States Patent and Trademark Office. The content of which is incorporated herein by reference in its entirety.

FIELD OF THE INVENTION

The invention relates to photoresist compositions and methods for photolithography using the same.

BACKGROUND OF THE INVENTION

Optical photolithography has been the major technique for the semiconductor industry. Many resolution enhancement technology (RET) methods have also contributed to the extension of optical photolithography to print very low $k_1$ images. The value of $k_1$ can be found using the optical projection lithography resolution equation $W=k_1 \lambda/NA$, where W is the minimum printable feature size, $\lambda$ is the exposure wavelength (e.g. 193 nm, 157 nm), NA is the numerical aperture of the lithography system and $k_1$ is a lithographic constant of the system. Double exposure (DE) has emerged as a method to reduce $k_1$ in the fabrication of integrated circuit chips. Several double exposure schemes have been developed including double dipole lithography (DDL) and double exposure double etch ($DE^2$). However, DDL can only print images within diffraction limit, while $DE^2$ is a complex and expensive process. Accordingly, there exists a need to overcome the deficiencies and limitations described hereinabove.

SUMMARY OF THE INVENTION

The present invention relates to a resist composition, comprising:
a polymer comprising first repeating units containing a lactone moiety, said polymer having the properties of being substantially soluble in a first solvent and becoming substantially insoluble in said first solvent after heating said polymer to a first temperature of about 140° C. or greater;
a thermal base generator capable of releasing a base upon heating said thermal base generator above a second temperature; and
a photosensitive acid generator capable of releasing acid upon exposure to radiation The present invention relates to a method comprising:
forming a first film of a first photoresist on a substrate, said first photoresist comprising a first polymer, a thermal base generator capable of releasing a base above a first temperature, a first photosensitive acid generator capable of generating an acid upon exposure to radiation, and a first solvent, said first photoresist having the properties of being substantially soluble in said solvent and becoming substantially insoluble in said solvent after heating said first photoresist to above a second temperature;
patternwise imaging said first film through a first mask, said imaging comprising exposing at least one region of said first film to radiation, resulting in producing a first acid catalyst in said at least one exposed region of said first film;
after said imaging, developing said first film in an aqueous base, resulting in removing base-soluble exposed regions of said first film and forming a first patterned layer of said first film; and
baking said first patterned layer above said first temperature and above said second temperature, wherein resulting from said baking said first thermal base generator releases a base within said first patterned layer, wherein resulting from said baking said first patterned layer becomes substantially insoluble in said first solvent.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings.

DETAILED DESCRIPTION OF THE INVENTION

Figure 1:
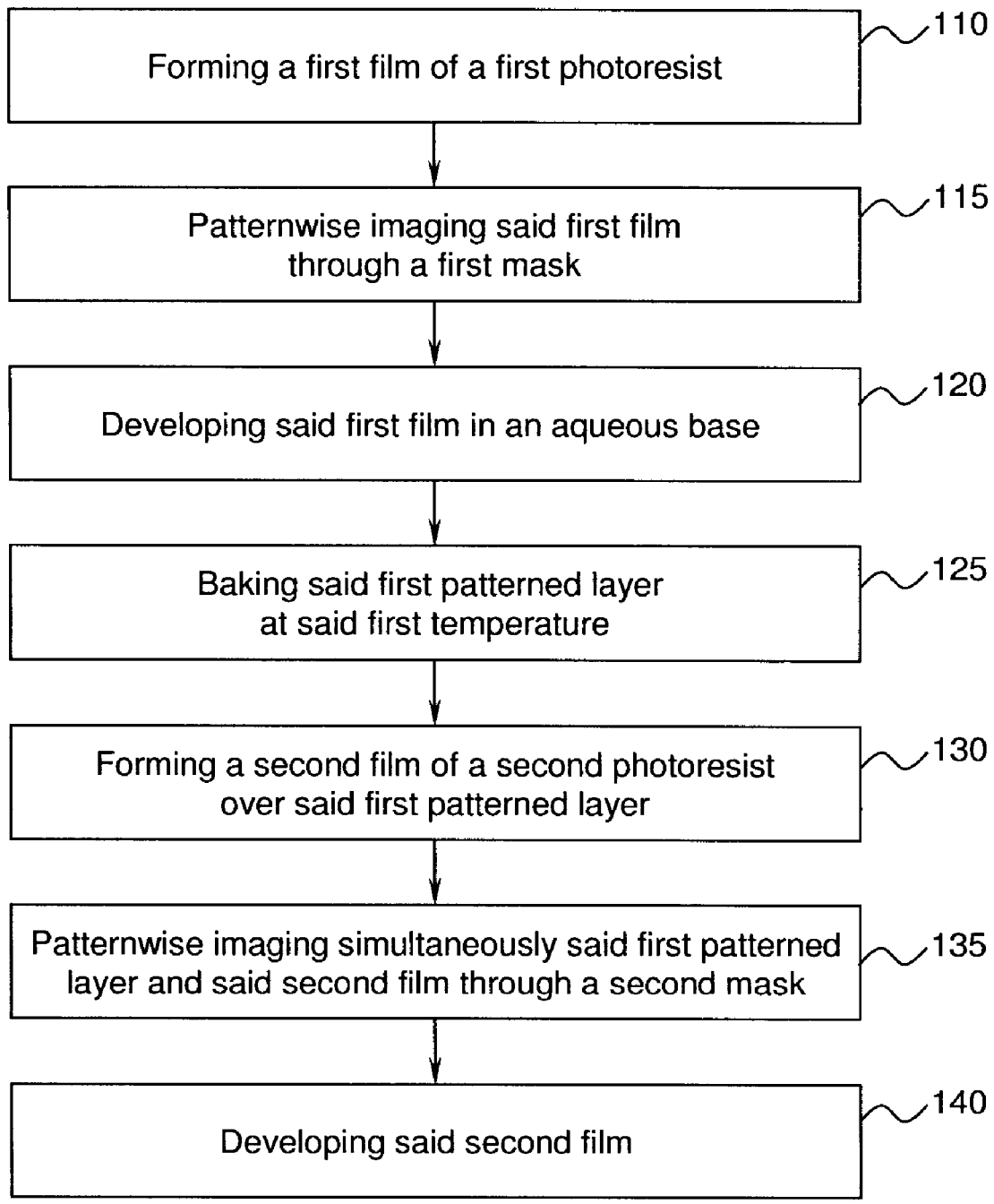
FIG. 1 is a flow chart illustrating a method for forming patterned layers, in accordance with embodiments of the present invention.

Although certain embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as examples of embodiments. The features and advantages of the present invention are illustrated in detail in the accompanying drawings, wherein like reference numerals refer to like elements throughout the drawings. Although the drawings are intended to illustrate the present invention, the drawings are not necessarily drawn to scale.

FIG. 1 is a flow chart illustrating a method for forming patterned layers, such as in photolithography, in an embodiment of the present invention. In step 110, a first film of a first photoresist is formed on a substrate. The photoresist may comprise a first polymer, a thermal base generator capable of releasing a base above a first temperature, and a first photosensitive acid generator. The first polymer may have the property of being substantially soluble in a solvent and becoming substantially insoluble in the solvent after heating the polymer, such as to a temperature of about 140° C. or greater, such as from about 140° C. to about 260° C. for example. The photoresist composition may have the property of being substantially soluble in a solvent and becoming substantially insoluble in the solvent after heating the polymer, such as to a temperature of about 140° C. or greater, such as from about 140° C. to about 260° C. for example.

The polymer of the photoresist may comprise repeating units of one or more structures, for example the polymer may comprise a copolymer, a terpolymer, a tetrapolymer, etc.

The polymer may have repeating units containing a lactone moiety in combination with repeating units containing at least one acid labile moiety, where such a configuration may impart good lithographic performance to the photoresist. Lactone moieties may improve dissolution in aqueous developer. Examples of repeating units containing lactones moieties include 5-methacryloyloxy-2,6-norbornanecarbo-γ-lactone, 3-methacryloyloxymethyl-2,6-norbornanecarbo lactone, 3-acryloyloxymethyl-2,6-norbornanecarbo lactone, α-acryloyloxy-γ-butyrolactone, α-methacryloyloxy-γ-butyrolactone, β-acryloyloxy-γ-butyrolactone and β-methacryloyloxy-γ-butyrolactone. Examples of tertiary ester moieties include those that can be deprotected by acid generated by the photoacid generator. Examples of tertiary ester moieties include ester derivatives of structural groups such as: methyladamantane, ethyladamantane, methylcyclopentane, ethylcyclopentane, methylcyohexane, ethylcycohexane, methylcycloheptane, ethylcyclohepatane, methylcyclooctane, ethylcyclooctane, and t-butyl.

For example, the polymer may comprise first repeating units of having lactone moieties such as

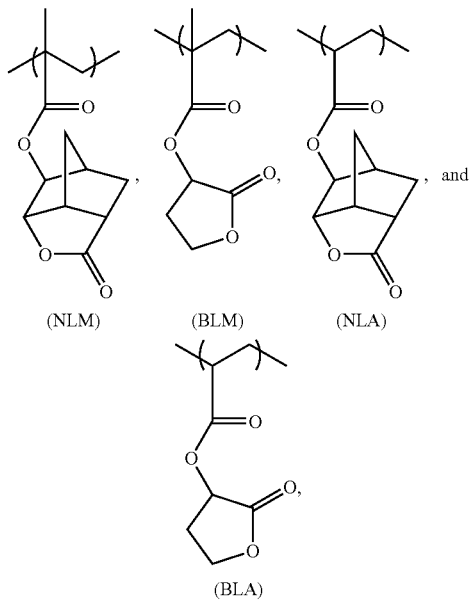

(NLM)    (BLM)    (NLA)

(BLA)

where the polymer may further comprise second repeating units having at least one tertiary ester moiety such as

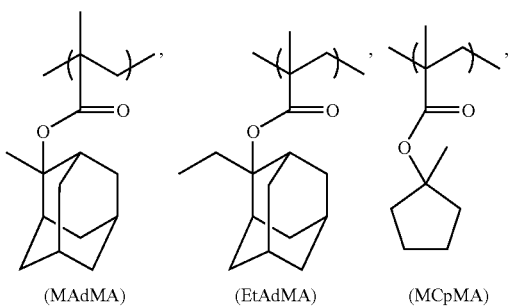

(MAdMA)    (EtAdMA)    (MCpMA)

-continued

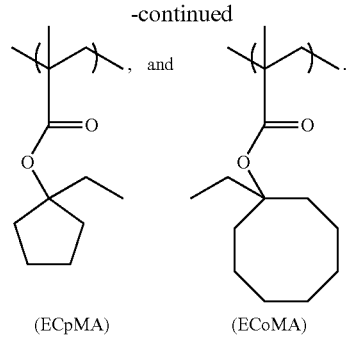

(ECpMA)    (ECoMA)

For example, the polymer may be represented by:

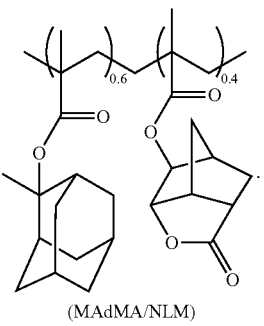

(MAdMA/NLM)

The polymer may further comprise third repeating units, where the third repeating units may enhance the change of the solubility of the photoresist in the casting solvent from substantially soluble to substantially insoluble, such as during a high temperature bake.

The term substantially insoluble, as used herein, is intended to comprise having such a small degree of solubility so as to not affect the quality of an image formed from a photoresist by loss of material (e.g. polymer, photoresist, etc.) through dissolution into aqueous base solution or photoresist solvents from regions of the photoresist layer not containing photosensitive acid generator derived acid. The term substantially soluble, as used herein, is intended to comprise having a high enough degree of solubility in aqueous base solutions or solvents so to allow all or almost all (i.e., any remaining material is present such a small amounts so as to not interfere with subsequent processing steps) of the material (e.g. polymer, photoresist, etc.) in regions containing acid derived from the photosensitive acid generator to dissolve into aqueous base solutions or photoresist solvents. In the context of photoresist formulation and semiconductor processing the term substantially insoluble is intended to include polymers completely or almost completely insoluble in photoresist solvents. In the context of photoresist formulation and semiconductor processing the term substantially soluble is intended to include polymers completely or almost completely soluble in photoresist solvents. In general, the polymer dissolution rates affect the dissolution rates of the photoresist layers most strongly, thus a substantially insoluble polymer may render substantially insoluble a photoresist comprising that polymer. Substantially insoluble photoresists have a dissolution rate of less than about 0.2 nanometers/second (nm/s) in solvent or aqueous base, while substantially soluble photoresists have a dissolution rate of greater than about 5 nm/s in solvent or aqueous base. Photoacid generators, quencher and other additives may also alter the dissolution rates of the final photoresist layer.

The third repeating units may comprise hydroxyl groups, such as alkyl alcohols, carboxylic acids, or a combination of these, such as:

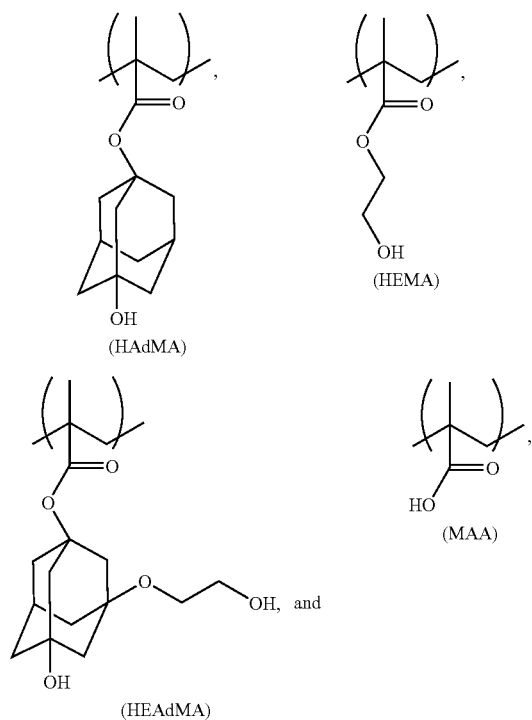

(HAdMA), (HEMA), (HEAdMA), (MAA)

such as in the following examples:

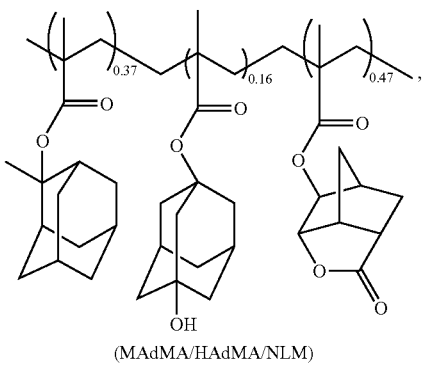

(MAdMA/HAdMA/NLM)

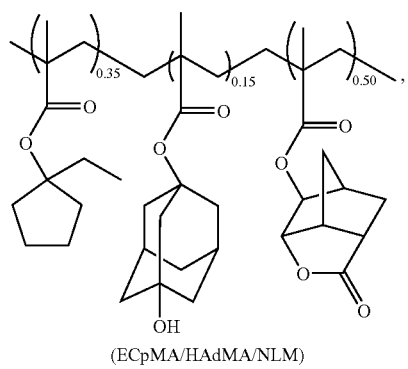

(ECpMA/HAdMA/NLM)

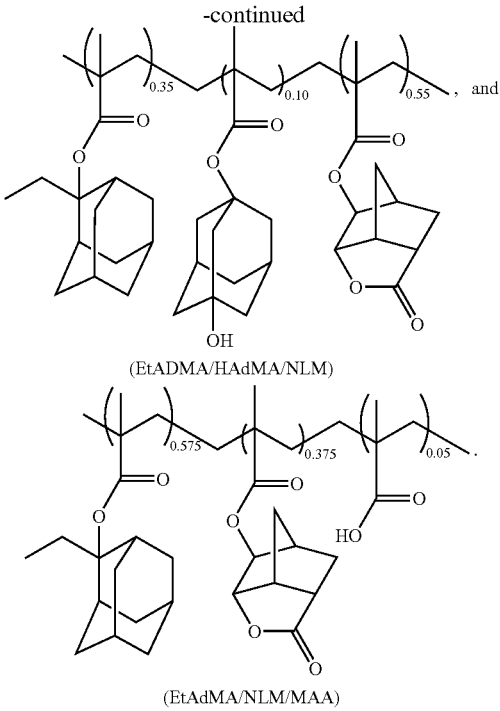

(EtADMA/HAdMA/NLM) and (EtAdMA/NLM/MAA)

The polymer structure may further comprise fourth repeating units. The fourth repeating units may be configured to stabilize the photoresist image during developing process, wherein the fourth repeating units may have some solubility toward aqueous developer and may contain a moiety selected from the group consisting of sulfonamides, fluorinated sulfonamides, fluoroalcohols, dicarboxylmides, N-hydroxy dicarboxylmides, phenol, naphthol, amino and imino groups. An example of a fourth repeating unit includes:

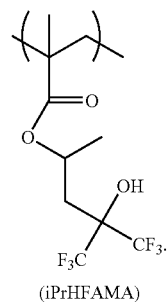

(iPrHFAMA)

An example of a resist polymer comprising a fourth repeating unit includes:

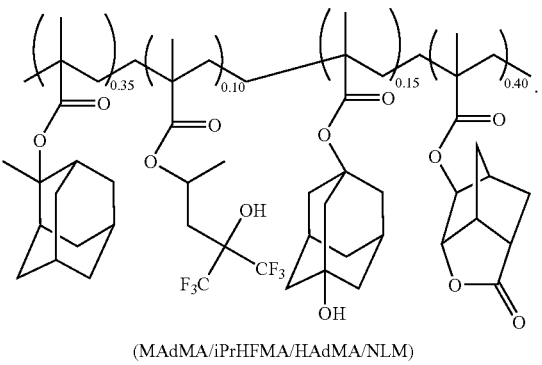

(MAdMA/iPrHFMA/HAdMA/NLM)

The fourth repeating unit may comprise structures described above for the second repeating units, such as MAdMA, EtAdMA, MCpMA, ECpMA, and ECoMA, such that the polymer structure comprises two different repeating units containing at least two different tertiary ester moieties. The difference in deprotection rates of the two ester groups may improve the stability of an image produced from the resist composition. Examples of polymers having a fourth repeating unit and comprising at least two different tertiary ester moieties include:

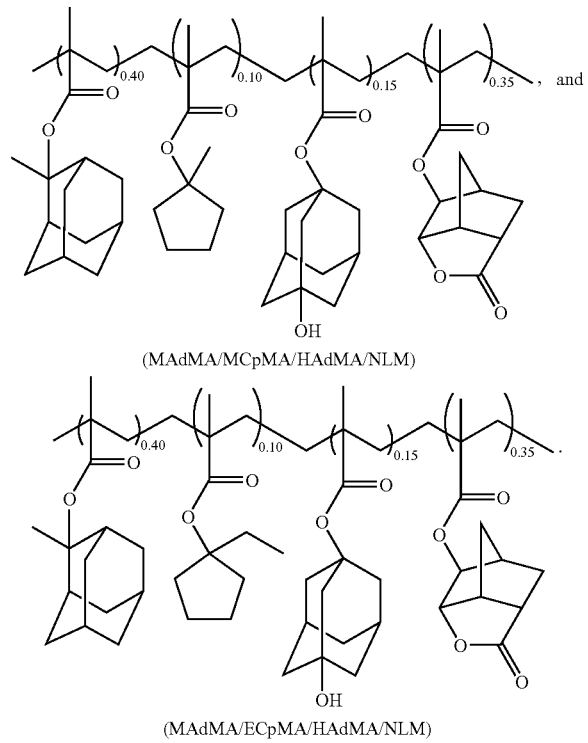

(MAdMA/MCpMA/HAdMA/NLM)

(MAdMA/ECpMA/HAdMA/NLM)

The polymer of the photoresist may comprise a polymer blend of two or more polymers, such as blends of two or more of the polymers described above.

The photoresist may further comprise a thermal base generator, where the thermal base generator may be capable of generating a base above a first temperature, T. T is a temperature of about 140° C. or greater, such as between about 140° C. and about 260° C. The thermal base generator may comprise a compound belonging to a group such as amides, sulfonamides, imides, imines, O-acyl oximes, benzoyloxycarbonyl derivatives, quarternary ammonium salts, and nifedipines, examples of which may include o-{(β-(dimethylamino)ethyl)aminocarbonyl}benzoic acid, o-{(γ-(dimethylamino)propyl)aminocarbonyl}benzoic acid, 2,5-bis{(β-(dimethylamino)ethyl)aminocarbonyl}terephthalic acid, 2,5-bis{(γ-(dimethylamino)propyl)aminocarbonyl}terephthalic acid, 2,4-bis{(β-(dimethylamino)ethyl)aminocarbonyl}isophthalic acid, and 2,4-bis{(γ-(dimethylamino)propyl)aminocarbonyl}isophthalic acid.

In one embodiment, the thermal base generator may comprise at least one carbamate moiety. The preferred thermal base generators include fluorenylmethyl carbamates, phenylsulfonylethyl carbamates, and 3-nitropentane-2-yl carbamates, such as.

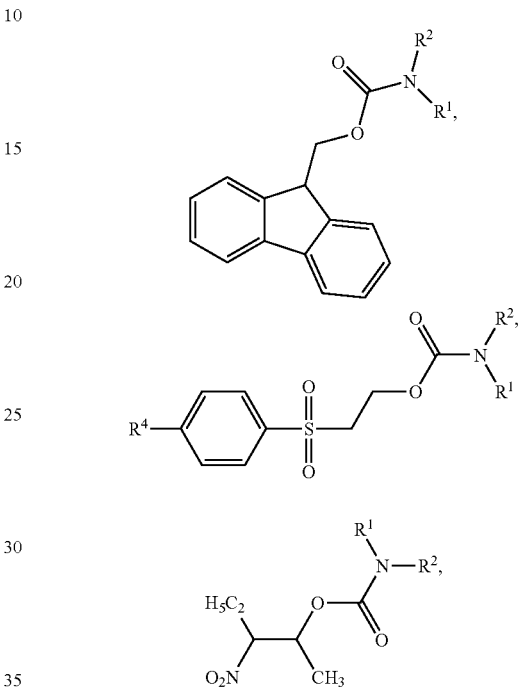

wherein each $R^1$ or $R^2$ is independently selected from the group consisting of a hydrogen atom, a linear alkyl, a branched alkyl, a cycloalkyl, a halogenated linear alkyl, a halogenated branched alkyl, a halogenated cycloalkyl, an aryl, a halogenated aryl, and combinations thereof, and wherein $R^4$ may be hydrogen or alkyl. For halogenated moieties, the halogen is preferably selected from fluorine, chlorine, and bromine. For example, each $R^1$ or $R^2$ may be independently selected from the group consisting of a fluorinated linear alkyl, a fluorinated branched alkyl, a fluorinated cycloalkyl, an aryl, a fluorinated aryl, and combinations thereof.

The thermal base generators described above may also be linked to form dimer structures, where such linking may prevent or reduce volatility of the base produced. Some examples of dimer forms of thermal base generators include:

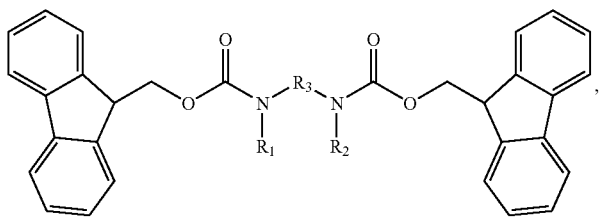

-continued

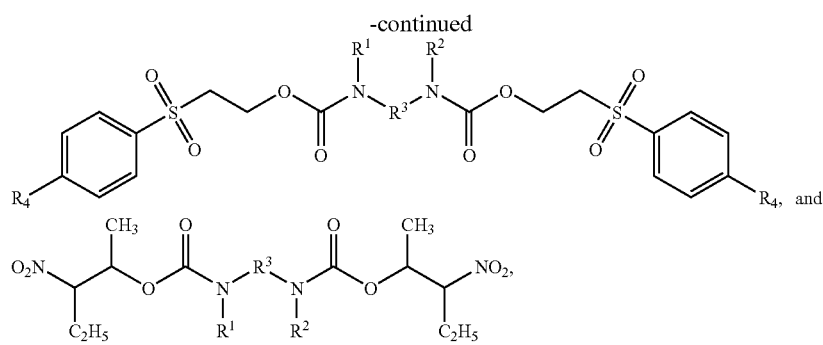

wherein each $R^1$ or $R^2$ is independently selected from the group consisting of a hydrogen atom, a linear alkyl, a branched alkyl, a cycloalkyl, a halogenated linear alkyl, a halogenated branched alkyl, a halogenated cycloalkyl, an aryl, a halogenated aryl, and combinations thereof, wherein $R^3$ is selected from the group consisting of a linear alkyl, a branched alkyl, a cycloalkyl, a halogenated linear alkyl, a halogenated branched alkyl, a halogenated cycloalkyl, an aryl, a halogenated aryl, and combinations thereof, and wherein $R^4$ may be hydrogen or alkyl. For halogenated moieties, the halogen is preferably selected from fluorine, chlorine, and bromine. For example, each $R^1$ or $R^2$ may be independently selected from the group consisting of a fluorinated linear alkyl, a fluorinated branched alkyl, a fluorinated cycloalkyl, an aryl, a fluorinated aryl, and combinations thereof, wherein $R^3$ is selected from the group consisting of a fluorinated linear alkyl, a fluorinated branched alkyl, a fluorinated cycloalkyl, an aryl, a fluorinated aryl, and combinations thereof.

Some specific examples of thermal base generators comprising a carbamate moiety include:

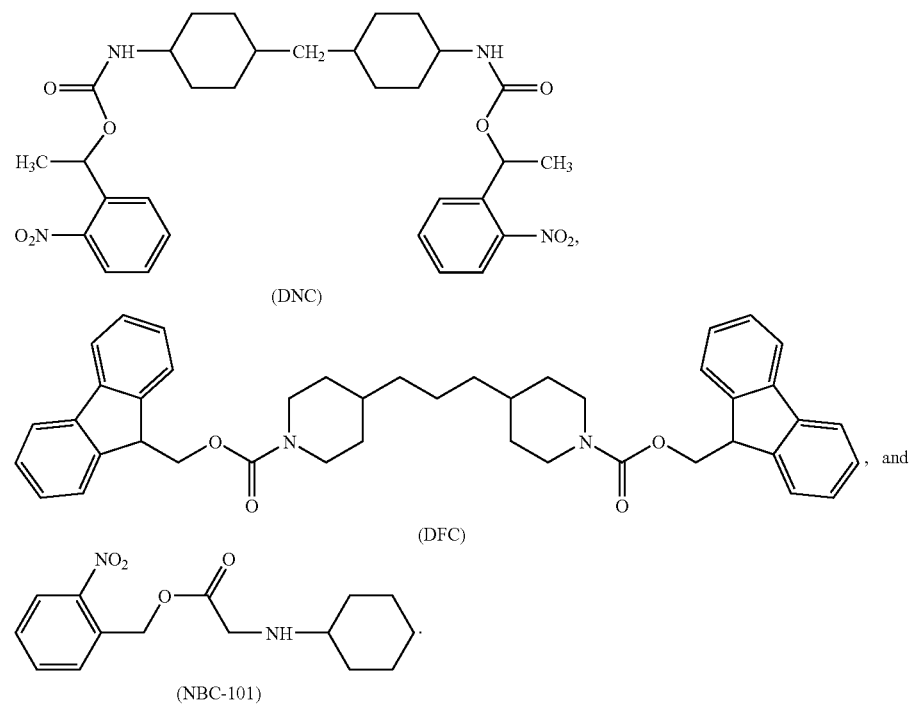

The most preferable thermal base generators are fluorenylmethyl carbamates, especially those fluorenylmethyl carbamates having thermal decomposition temperatures ($T_d$) below 220° C. and preferably below 200° C. Fluorenylmethyl carbamates usually have lower $T_d$ than other thermal base generators resulting to the generation of more bases than other thermal base generators during a post development bake at a temperature in the range between about 140° C. and about 260° C. The preferred post development bake temperature is between about 150° C. and about 220° C. The lower $T_d$ of fluorenylmethyl carbamates in comparison with other carbamates can be seen with a relatively lower $T_d$ of 175° C. for 1,6-bis[9-fluorenylmethoxy]carboylamino]hexane as shown below

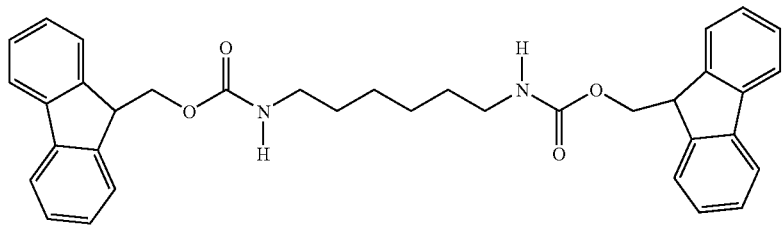

compared to a $T_d$ of 227° C. for 1,6-bis[2-nitrobenzyloxy]carboylamino]hexane as shown below:

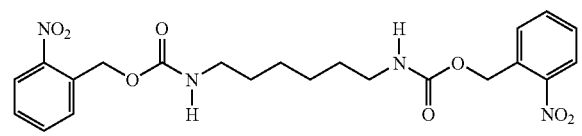

and a $T_d$ of 206° C. for N,N'-bis[[1-(3,5-dimethoxyphenyl)-1-methylethoxy]carbonyl]hexane-1,6-diamine as shown below

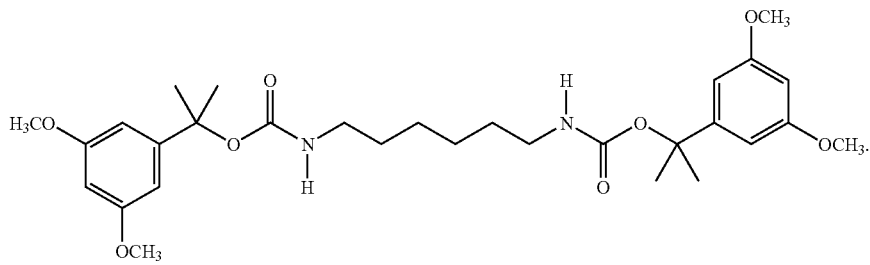

In another example, N-9H-fluoren-9-ylmethoxycarbonyl-4-piperidine as shown below has a first $T_d$ of 105° C. and a second $T_d$ of 160° C.,

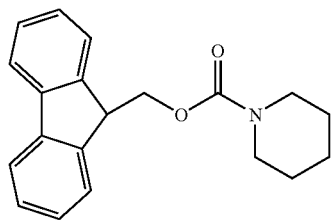

while N-[[1-(3,5-dimethoxyphenyl)-1-methylethoxy]carbonyl]piperidine as shown below

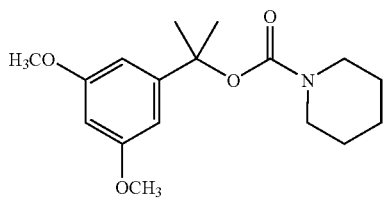

has a Td of 193° C.

The above described preferred thermal base generators are usually not sensitive to the commonly used optical radiation sources such as 193 nm and 248 nm light sources. Therefore, the loading of these base generators in a resist formulation generally would not have significant effect on the lithographic dose, as long as the baking temperature of the resist is not higher than the thermal decomposition temperature of the thermal base generators.

In another embodiment, the photoresist may comprise epoxide moieties or urethane moieties for base catalyzed crosslinking after subjecting the photoresist to a temperature above first temperature, T, baking such as to render the photoresist film insoluble to its own casting solvent. The photoresist may also comprise amic ester moieties for base catalyzed imidization, or pendant carboxyl moieties for base catalyzed decarboxylation, or carbonyl moieties (aldehyde moieties and ketone moieties) and active methylene moieties for base catalyzed cross-linking through Knoevenagel reaction.

The photoresist may further comprise a photosensitive acid generator (PAG), capable of releasing or generating acid upon exposure to radiation. The PAG may comprise, for example (trifluoro-methylsulfonyloxy)-bicyclo[2.2.1]hept-5-ene 2,3-dicarboximide (MDT), N-hydroxy-naphthalimide (DDSN), onium salts, aromatic diazonium salts, sulfonium salts, diaryliodonium salts, sulfonic acid esters of N-hydroxyamides, imides, or combinations thereof.

The photoresist may further comprise a surfactant. Surfactants may be used to improve coating uniformity, and may include ionic, non-ionic, monomeric, oligomeric, and polymeric species, or combinations thereof. Examples of possible surfactants include fluorine-containing surfactants such as the FLUORAD series available from 3M Company in St. Paul, Minn., and siloxane-containing surfactants such as the SILWET series available from Union Carbide Corporation in Danbury, Conn., USA.

The photoresist may include a casting solvent to dissolve the other components, so that the photoresist may be applied evenly on the substrate surface to provide a defect-free coating. Where the photoresist is used in a multilayer imaging process, the solvent used in the imaging layer may not be a solvent to the underlayer materials, otherwise unwanted intermixing may occur. Examples of suitable casting solvents may include ethers, glycol ethers, aromatic hydrocarbons, ketones, esters, ethyl lactate, γ-butyrolactone, cyclohexanone, ethoxyethylpropionate (EEP), a combination of EEP and gamma-butyrolactone (GBL), and propylene glycol methyl ether acetate (PGMEA). The present invention is not limited to the selection of any particular solvent.

The photoresist may include a base quencher, sensitizers or other expedients known in the art. The compositions of the photoresists described herein are not limited to any specific selection of these expedients, where base quenchers may comprise aliphatic amines, aromatic amines, carboxylates, hydroxides, or combinations thereof. For example base quenchers may include: dimethylamino pyridine, 7-diethylamino-4-methyl coumarin (Coumarin 1), tertiary amines, sterically hindered diamine and guanidine bases such as 1,8-bis(dimethylamino)naphthalene (PROTON SPONGE), berberine, or polymeric amines such as in the PLURONIC or TETRONIC series commercially available from BASF. Tetra alkyl ammonium hydroxides or cetyltrimethyl ammonium hydroxide may be used as a base quencher when the PAG is an onium salt.

The photoresist composition is not limited to any specific proportions of the various components. The photoresist composition may comprise about 1% by weight (wt %) to about 30 wt % of polymer based on the total weight of the composition, such as from about 2 wt % to about 15 wt %. The photoresist composition may comprise from about 0.1 wt % to about 30 wt % thermal base generator based on the weight of the polymer in the composition, such as from about 0.1 wt % to about 20 wt %. The photoresist composition may comprise from about 0.5 wt % to about 20 wt % photoacid generator based on the weight of the polymer in the composition, such as from about 0.5 wt % to about 10 wt %. The photoresist composition may comprise from about 70 wt % to about 99 wt. % solvent based on the total weight of the composition, such as from about 85 wt % to about 98 wt %. The photoresist composition may further include about 0.1 wt % to about 1.0 wt % of base quencher based on the total weight of the polymer in the composition. The photoresist composition may further include about 0.001 wt % to about 0.1 wt % of surfactant based on the total weight of polymer in the composition.

The photoresist may further comprise a surfactant and/or a base quencher as described above. The film may be formed by processes such as spin coating, spray coating, dip coating, doctor-blading, roll coating, and the like, which may be used individually or in combinations thereof in accordance with the methods of the present invention. The substrate may comprise materials of one or more of the IUPAC Groups 4, 6, 11, 12, 13, 14, and 15 elements, plastic material, silicon dioxide, glass, fused silica, mica, ceramic, metals deposited on the aforementioned substrates, combinations thereof, and the like. The substrate may comprise a stack or layering of different materials. For a substrate used in a trilayer approach, there may be a comparatively thick organic underlayer and a thin Si containing interlayer, where the Si containing layer may either be a chemical vapor deposited silicon oxide layer or a spin coated silsesquioxane polymer film. For example, a substrate may comprise a prepared silicon wafer substrate such as those employed in semiconductor manufacturing. The films and layers described herein may be disposed on top of the substrate or may be integrally joined with the substrate.

In step 115, the film is imaged patternwise through a first mask using a radiation or particle beam source, wherein at least one region of the first film is exposed to radiation or the particle beam, resulting in the photosensitive acid generator producing an acid catalyst in the at least one exposed region of the film, rendering the exposed regions of the resist substantially soluble in a developer. For a chemically amplified resist system, baking may deprotect acid labile groups in the polymer, regenerating base soluble groups through an acid catalyzed amplification process, thus the bake may render the exposed regions of the resist substantially soluble in a developer.

Figure 2A:
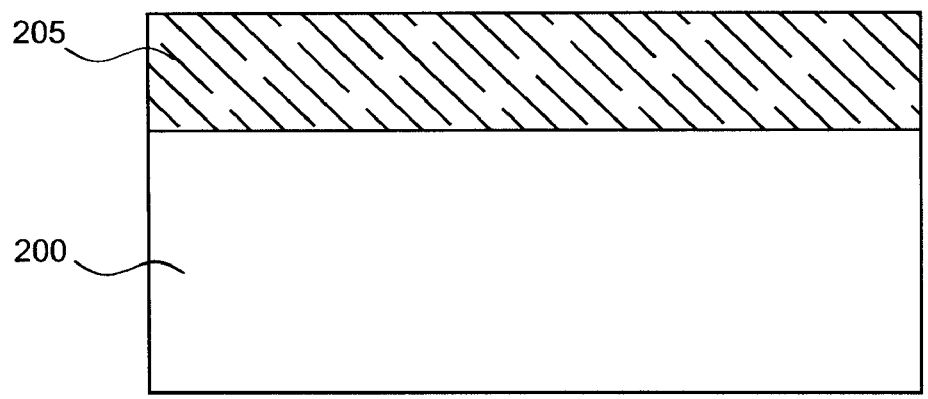
FIG. 2A is an illustration of a film disposed on a substrate, in accordance with embodiments of the present invention.
Figure 2B:
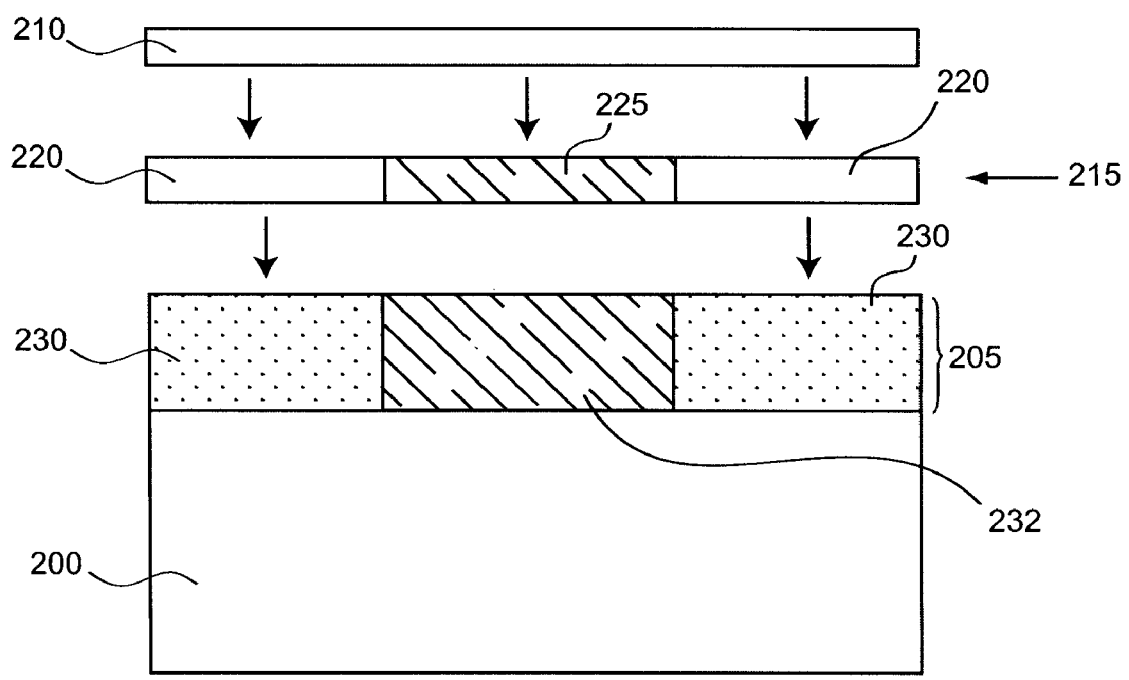
FIG. 2B is an illustration of patternwise imaging the film of FIG. 2A, in accordance with embodiments of the present invention.

FIG. 2A is an illustration of a film 205 disposed on a substrate 200, such as the films and substrates described above. FIG. 2B is an illustration of patternwise imaging the film of FIG. 2A as described for step 115 of FIG. 1, wherein a radiation or particle beam source 210 projects radiation or energetic particles through a patterned mask 215 onto the film 205 disposed on a substrate 200. The mask may have a pattern of masked sections 225 which are essentially opaque to the radiation or impenetrable to the energetic particles, and unmasked sections 220 which are essentially transparent to the radiation or penetrable to the energetic particles. Radiation or particles passing through the unmasked sections 220 may be transmitted to the film 205 to be absorbed in the exposed regions 230 of the film 205, wherein the radiation or particles may induce the production of an acid catalyst in the exposed regions 230 of the film 205. Unexposed regions 232 of film 205 may not produce an acid catalyst.

Exposure to the radiation or energetic particles may render the exposed regions 230 soluble in a developer. The photoresists of the present invention may be patternwise imaged using radiation such as ultraviolet (UV) such as wavelengths of approximately 436 nanometers (nm) and 365 nm, deep-ultraviolet (DUV) such as wavelengths of approximately 257 nm, 248 nm, 193 nm, and 157 nm, extreme-ultraviolet (EUV) such as a wavelength of approximately 4 nm to approximately 70 nm such as approximately 13 nm, x-ray, combinations of these, and the like. Various wavelengths of radiation may be used such as 313 nm, 334 nm, 405 nm, and 126 nm etc., where the sources may be mainly from specific mercury emission lines or specific lasers. For high performance lithography, single wavelength and/or narrow band radiation sources may be used. For less stringent conditions, a broad band multiple wavelength source may be used. The photoresist compositions of the present invention may be patternwise imaged using particle beams such as electron beam, ion beam, combinations of these, and the like. The appropriate radiation or particle beam type(s) may depend on the components of the overall photoresist composition (e.g., the selection of the molecular glass composition, photosensitive acid generator (PAG), base (or quencher), surfactant, solvent, etc.).

Figure 2C:
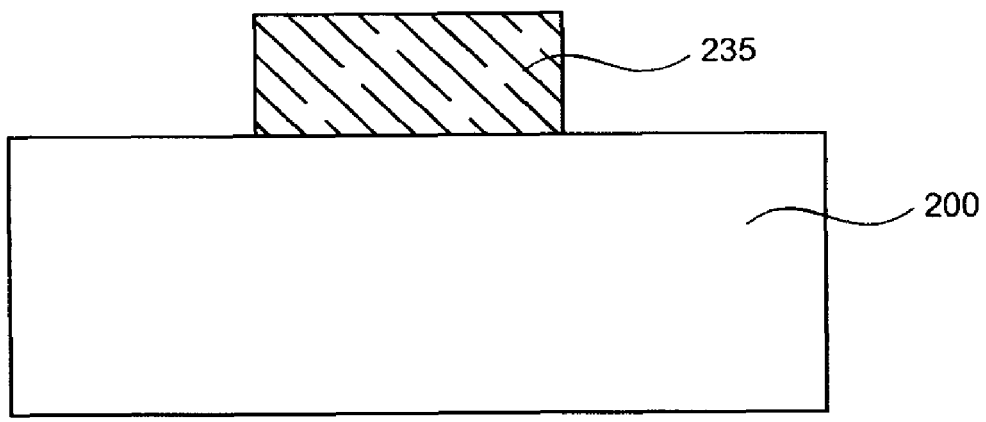
FIG. 2C is an illustration of the film of FIG. 2B after removal of base-soluble exposed regions of FIG. 2B, in accordance with embodiments of the present invention.

Referring again to FIG. 1, in step 120 the film is developed in an aqueous base solution where the base-soluble exposed regions of the film may be removed from the film to form a first patterned layer of the first film. The developer may be organic or aqueous based, such as an aqueous base developer such as tetramethylammonium hydroxide aqueous solution, for example. FIG. 2C is an illustration of the film of FIG. 2B after removal of base-soluble exposed regions 230 of FIG. 2B, where a first patterned layer 235 remains on the substrate 200.

Referring again to FIG. 1, in step 125 the first patterned layer is baked above the first temperature, T. The first temperature, T, may be about 140° C., such as between about 140° C. and about 260° C. Resulting from the baking, the thermal base generator releases a base within the first patterned layer. Resulting from the baking, said first patterned layer becomes substantially insoluble in the first solvent.

Figure 2D:
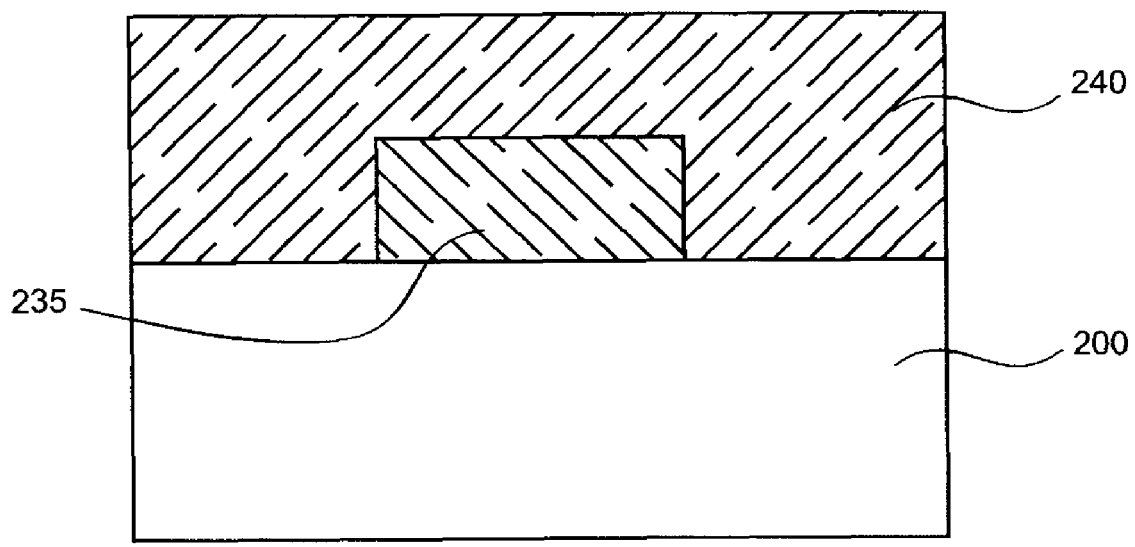
FIG. 2D is an illustration of the first patterned layer of FIG. 2C after a second film of a second photoresist is formed over the first patterned layer, in accordance with embodiments of the present invention.

In step 130, after the baking of step 125, a second film is formed of a second photoresist over the first patterned layer formed in step 120. The second photoresist may comprise a second polymer and a second photosensitive acid generator. The first polymer and the second polymer may have the same composition or may be different. For example, the second polymer may comprise a polymer such as those described above, or a polymer known in the art for use in photoresist compositions. FIG. 2D is an illustration of the first patterned layer 235 of FIG. 2C after a second film 240 of a second photoresist is formed over the first patterned layer 235.

Referring again to FIG. 1, step 135 comprises patternwise imaging simultaneously the first patterned layer and the second film through a second mask. The simultaneous imaging may expose at least one region of the second film to radiation and result in producing a second acid catalyst in the at least one exposed region of the second film. Acid catalyst produced in the first patterned layer as result of the simultaneous imaging is neutralized by the base released in the baking of step 125, thus the integrity of first patterned layer is protected from degradation as a result of the simultaneous imaging in step 135.

Figure 2E:
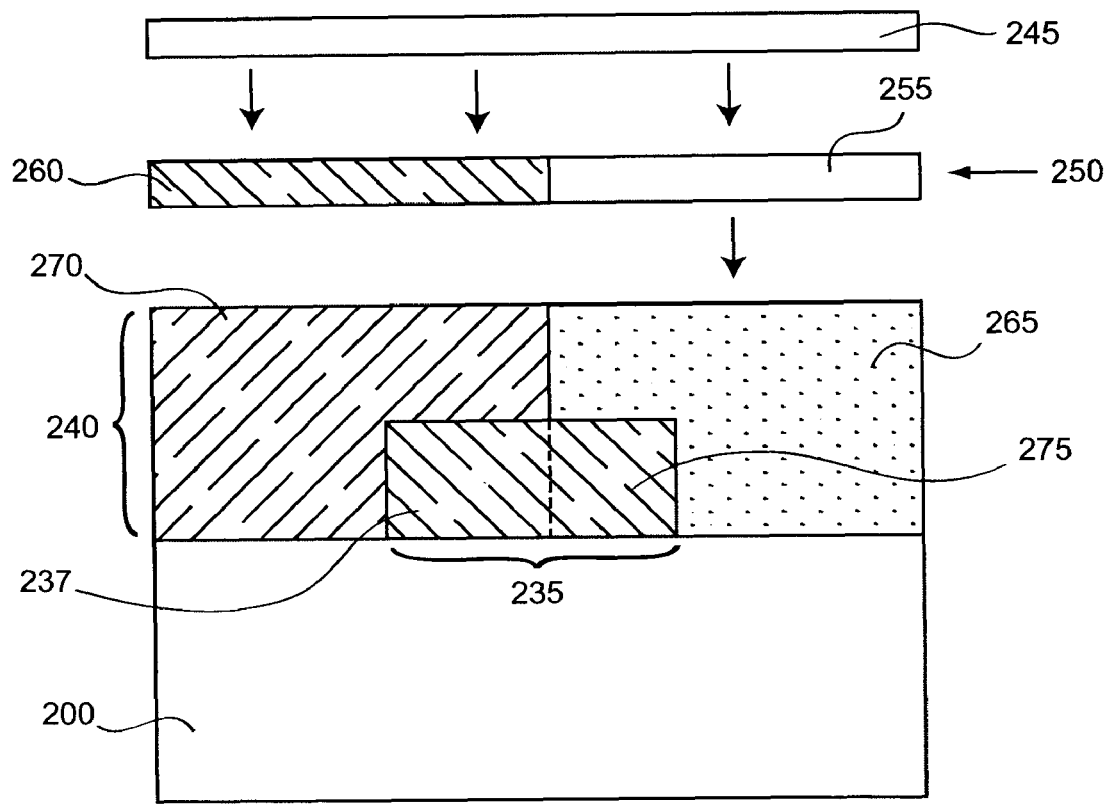
FIG. 2E is an illustration of the layers of FIG. 2D upon simultaneous exposure to radiation or energetic particles, in accordance with embodiments of the present invention.

FIG. 2E is an illustration of the layers of FIG. 2D upon simultaneous exposure to radiation or energetic particles from a radiation or particle beam source 245 projected through a second patterned mask 250. The first patterned layer 235 and the second film 240 may be exposed simultaneously. The second mask may have a pattern of masked sections 260 which are essentially opaque to the radiation or impenetrable to the energetic particles, and unmasked sections 250 which are essentially transparent to the radiation or penetrable to the energetic particles. Radiation or particles passing through the unmasked sections 250 may be transmitted to both the second film 240 and the first patterned layer 235 to be absorbed in the exposed regions 270 of the second film 240 and exposed regions 275 of the first patterned layer. The radiation or particles may induce the production of an acid catalyst in both the exposed regions 265 of the second film 240 and the exposed regions 275 of the first patterned layer 235. The acid catalyst in the exposed regions 265 of the second film 240 may, for example, render those exposed regions soluble in a developer. In another example, the acid catalyst in the second film 240 may crosslink the polymer of the second film 240 rendering exposed regions of the second film 265 insoluble in a developer. Acid catalyst produced in exposed regions 275 of the first patterned layer 235 is neutralized by the base present in the first patterned layer 235 which was produced in the baking in step 125. Unexposed regions 265 of the second film 240 and of the first patterned layer 235 may not produce an acid catalyst.

Figure 2F:
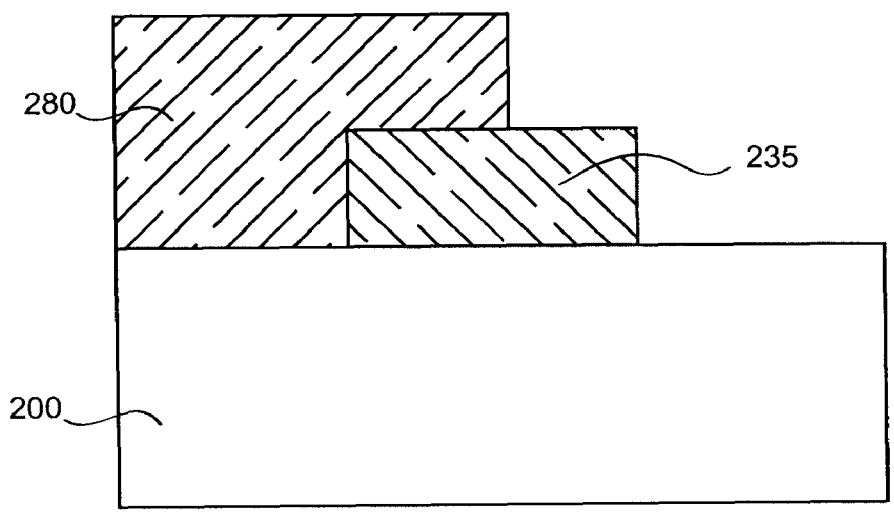
FIG. 2F is an illustration of the films of FIG. 2E after developing, in accordance with embodiments of the present invention.

Referring again to FIG. 1, step 140 comprises developing the second film, resulting in removing regions of the second film and forming a second patterned layer of said second film. For example, the developing of the second film in step 140 may comprise developing the second film in an aqueous base, where removing the regions of the second film comprises removing exposed base-soluble regions of said second film. In another example, developing the second film of step 140 may comprise developing the second film in a developer where cross-linked exposed regions of the second film remain after developing and unexposed, non-crosslinked regions are removed by the developer. FIG. 2F is an illustration of the films of FIG. 2E after developing, where exposed regions of the second film 140 of FIG. 2E have been removed to leave a second patterned layer 280. The first patterned layer 235 is essentially unchanged by the developing of step 140.

In one embodiment, after the patternwise imaging of the first film and before the developing of the first film, the first film may be baked at a temperature between about 80° C. and about 150° C.

EXAMPLE 1

A terpolymer (MAdMA/HAdMA/NLM) consisting of 37 mole % MAdMA, 16 mole % HAdMA and 47 mole % NLM was dissolved in PGMEA with 30 weight % (wt %, relative to polymer) GBL, 4 wt % TPSN (triphenyl sulfonium nonaflate) and 1.2 wt % of DFC to make a solution with 6.6 wt % of solid content. The resulting solution was filtered through a 0.2 micron (μm) filter. The resist was spin coated onto a 12" silicon wafer which had an approximately 42 nm thickness coating of Rohm and Haas AR40A, an bottom antireflective coating (BARC). The resist was post-applying baked (PAB) at about 130° C. for about 60 seconds and exposed to 193 nm wavelength light on an ASML stepper (0.8 NA, 0.78 σ partial coherence illumination). The wafer was then post-exposure baked (PEB) at about 125° C. for about 60 seconds. The film was developed using a single puddle develop process for about 30 seconds with 0.263 N TMAH (tetramethylammonium hydroxide) developer (Moses Lake's AD-10). Under these process conditions, the 70 nm lines on a 280 nm pitch were resolved. The wafer was then post-developing baked (PDB) at about 200° C. for about 90 seconds.

A JSR AM2073J resist was then spin coated on the above mentioned wafer. The resist was PAB at about 110° C. for about 60 seconds and exposed to 193 nm wavelength light on an ASML stepper (0.8 NA, 0.78 σ partial coherence illuminations). During the exposure, the reticle was shifted so that the same set of 70 nm lines can be printed in-between the $1^{st}$ layer resist. The wafer was then PEB at 120° C. for 60 seconds. It was developed using a single puddle develop process for 30 seconds with 0.263 N TMAH developer (Moses Lake's AD-10). Under these process conditions, the 70 nm line from $2^{nd}$ resist was printed in-between another 70 nm line from $1^{st}$ resist to form a 70 nm line and space on a 140 nm pitch.

EXAMPLE 2

A terpolymer (MAdMA/HAdMA/NLM) consisting of 37 mole % MAdMA, 16 mole % HAdMA and 47 mole % NLM was dissolved in PGMEA with 30 wt % GBL, 4 wt % TPSN, 0.105 wt % of bockbim (tert-butyl 2-phenyl-1,3-benzodiazole-1-carboxylate) and 0.59 wt % of NBC-101 (all wt % relative to polymer) to make a solution with 4.9 wt % of solid content. The resulting solution was filtered through a 0.2 μm filter. The resist was spin coated onto a 12" silicon wafer which had a 42 nm thickness coating of Rohm and Haas AR40A. The resist was post-applying baked (PAB) at about 130° C. for about 60 seconds and exposed to 193 nm wavelength light on a ASML stepper (0.93 NA, 0.85 outer and 0.6 inner σ annular illumination). The wafer was then post-exposure baked (PEB) at about 125° C. for about 60 seconds. The coated wafer was then developed using a single puddle develop process for about 30 seconds with 0.263 N TMAH developer (Moses Lake's AD-10). Under these process conditions, the 80 nm lines on a 160 nm pitch were resolved. The wafer was then post-developing baked (PDB) at about 190° C. for about 120 seconds.

The same resist formula as mentioned in this example was then spin coated onto the above coated and developed wafer. The resist was PAB at about 110° C. for about 60 seconds and exposed to 193 nm wavelength light on an ASML stepper (0.93 NA, 0.85 outer and 0.6 inner σ annular illumination). During the exposure, the reticle was rotated 90° so that the same set of 80 nm lines but oriented 90° with respect to $1^{st}$ layer lines can be printed on top of the $1^{st}$ layer resist. The wafer was then PEB at about 120° C. for about 60 seconds. The coated wafer was then developed using a single puddle develop process for about 30 seconds with 0.263 N TMAH developer (Moses Lake's AD-10). Under these process conditions, the spaces between 1$^{st}$ layer lines and 2$^{nd}$ layer lines became 80 nm square contact holes on 160 nm pitch.

EXAMPLE 3

A terpolymer (ECpMA/HAdMA/NLM) consisting of 35 mole % ECpMA, 15 mole % HAdMA and 50 mole % NLM was dissolved in 70/30 wt % PGMEA/Ethyl Lactate co-solvent with 4 wt % TPSN, 0.21 wt % bockbim and 0.59 wt % of NBC-101 (all wt % relative to polymer) to make a solution with 4.3 wt % of solid content. The resulting solution was filtered through a 0.2 µm filter. The resist was spin coated onto a 12" silicon wafer which had a 42 nm thickness coating of Rohm and Haas AR40A. The resist was post-applying baked (PAB) at about 130° C. for about 60 seconds and exposed to 193 nm wavelength light on an ASML stepper (1.2 NA, 30° Quasar illumination with 0.8 outer and 0.6 inner σ annular illumination). The wafer was then post-exposure baked (PEB) at 125° C. for about 60 seconds. The coated wafer was developed using a single puddle develop process for about 30 seconds with 0.263 N TMAH developer (Moses Lake's AD-10). Under these process conditions, the 50 nm lines on a 200 nm pitch were resolved. The wafer was then post-developing baked (PDB) at about 200° C. for about 90 seconds.

A JSR AM2073J resist was then spin coated onto the above coated and developed wafer. The resist was PAB at about 110° C. for about 60 seconds and exposed to 193 nm wavelength light on an ASML stepper (1.2 NA, 30° Quasar illumination with 0.8 outer and 0.6 inner σ annular illumination). During the exposure, the reticle was shifted so that the same set of 50 nm lines can be printed in-between the 1" layer resist. The wafer was then PEB at about 120° C. for about 60 seconds. The coated wafer was developed using a single puddle develop process for about 30 seconds with 0.263 N TMAH developer (Moses Lake's AD-10). Under these process conditions, the 50 nm line from 2$^{nd}$ resist was printed in between another 50 nm line of the 1$^{st}$ resist to form a 50 nm line and space on a 100 nm pitch.

EXAMPLE 4

A tetrapolymer (MAdMA/MCpMAHAdMA/NLM) consisting of 40 mole % MAdMA, 10 mole % MCpMA, 15 mole % HAdMA and 35 mole % NLM was dissolved in 70/30 wt % PGMEA/Ethyl Lactate co-solvent with 4 wt % TPSN, 0.21 wt % bockbim and 0.59 wt % of NBC-101 (all wt % relative to polymer) to make a solution with 4.3 wt % of solid content. The resulting solution was filtered through a 0.2 µm filter. The resist was spin coated onto a 12" silicon wafer which had a 42 nm thickness coating of Rohm and Haas AR40A. The resist was post-applying baked (PAB) at about 110° C. for about 60 seconds and exposed to 193 nm wavelength light on an ASML stepper (1.2 NA, 30° Quasar illumination with 0.8 outer and 0.6 inner σ). The wafer was then post-exposure baked (PEB) at about 120° C. for about 60 seconds. The coated wafer was developed using a single puddle develop process for about 30 seconds with 0.263 N TMAH developer (Moses Lake's AD-10). Under these process conditions, the 35 nm lines on a 140 nm pitch were resolved. The wafer was then post-developing baked (PDB) at about 200° C. for about 90 seconds.

A JSR AM2073J resist was then spin coated onto the above coated and developed wafer. The resist was PAB at about 110° C. for about 60 seconds and exposed to 193 nm wavelength light on an ASML stepper (1.2 NA, 30° Quasar illumination with 0.8 outer and 0.6 inner σ annular illumination). During the exposure, the reticle was shifted so that the same set of 35 nm lines can be printed in between the 1$^{st}$ layer of resist. The wafer was then PEB at about 120° C. for about 60 seconds. It was developed using a single puddle develop process for about 30 seconds with 0.263 N TMAH developer (Moses Lake's AD-10). Under these process conditions, the 35 nm line from the 2$^{nd}$ resist was printed in between another 35 nm line from the 1$^{st}$ resist to form a 35 nm line and space on a 70 nm pitch.

EXAMPLE 5

A tetrapolymer (MAdMA/iPrHFAMA/HAdMA/NLM) consisting of 35 mole % MAdMA, 10 mole % iPrHFAMA, 15 mole % HAdMA and 40 mole % NLM was dissolved in PGMEA, with 1.28 wt % GBL, 4 wt % TPSN, 0.21 wt % bockbim and 0.69 wt % of NBC-101 (all wt % relative to polymer) to make a solution with 4.3 wt % of solid content. The resulting solution was filtered through a 0.2 µm filter. The resist was spin coated onto a 12" silicon wafer which had a 42 nm thickness coating of Rohm and Haas AR40A. The resist was post-applying baked (PAB) at about 130° C. for about 60 seconds and exposed to 193 nm wavelength light on an ASML stepper (1.2 NA, 30° Quasar illumination with 0.8 outer and 0.6 inner σ annular illumination). The wafer was then post-exposure baked (PEB) at about 125° C. for about 60 seconds. The coated wafer was then developed using a single puddle develop process for about 30 seconds with 0.263 N TMAH developer (Moses Lake's AD-10). Under these process conditions, the 50 nm lines on a 200 nm pitch were resolved. The wafer was then post-developing baked (PDB) at about 200° C. for about 90 seconds.

A JSR AM2073J resist was then spin coated onto the above coated and developed wafer. The resist was PAB at about 110° C. for about 60 seconds and exposed to 193 nm wavelength light on an ASML stepper (1.2 NA, 30° Quasar illumination with 0.8 outer and 0.6 inner σ annular illumination). During the exposure, the reticle was shifted so that the same set of 50 nm lines can be printed in between the 1$^{st}$ layer of resist. The wafer was then PEB at about 120° C. for about 60 seconds. The coated wafer was developed using a single puddle develop process for about 30 seconds with 0.263 N TMAH developer (Moses Lake's AD-10). Under these process conditions, the 50 nm line from the 2$^{nd}$ resist was printed in between another 50 nm line from 1$^{st}$ resist to form a 50 nm line and space on a 100 nm pitch.

EXAMPLE 6

A polymer blend of 75 wt % terpolymer MAdMA/HAdMA/NLM consisting of 37 mole % MAdMA, 16 mole % HAdMA and 47 mole % NLM and 25 wt % terpolymer ECpMA/HAdMA/NLM consisting of 35 mole % ECpMA, 15 mole % HAdMA and 50 mole % NLM was dissolved in 70/30 wt % PGMEA/Ethyl Lactate co-solvent with 4 wt % TPSN, 0.21 wt % bockbim and 0.59 wt % of NBC-101 (all wt % relative to total polymer weight) to make a solution with 4.3 wt % of solid content. The resulting solution was filtered through a 0.2 µm filter. The resist was spin coated onto a 12" silicon wafer which had a 42 nm thickness coating of Rohm and Haas AR40A. The resist was post-applying baked (PAB) at about 130° C. for about 60 seconds and exposed to 193 nm wavelength light on an ASML stepper (1.2 NA, 30° Quasar illumination with 0.8 outer and 0.6 inner σ annular illumination). The wafer was then post-exposure baked (PEB) at about 125° C. for about 60 seconds. It was developed using a single puddle develop process for about 30 seconds with 0.263 N TMAH developer (Moses Lake's AD-10). Under these process conditions, the 35 nm lines on a 140 nm pitch were resolved. The wafer was then post-developing baked (PDB) at about 190° C. for about 90 seconds.

A JSR AM2073J resist was then spin coated on the above coated and developed wafer. The resist was PAB at about 110° C. for about 60 seconds and exposed to 193 nm wavelength light on an ASML stepper (1.2 NA, 30° Quasar illumination with 0.8 outer and 0.6 inner σ annular illumination). During the exposure, the reticle was shifted so that the same set of 35 nm lines can be printed in between the $1^{st}$ layer of resist. The wafer was then PEB at about 120° C. for about 60 seconds. It was developed using a single puddle develop process for about 30 seconds with 0.263 N TMAH developer (Moses Lake's AD-10). Under these process conditions, the 35 nm line from the $2^{nd}$ resist was printed in between another 35 nm line from the $1^{st}$ resist to form a 35 nm line and space on a 70 nm pitch.

EXAMPLE 7

A polymer blend of 90% of terpolymer MAdMA/HAdMA/NLM consisting of 37 mole % MAdMA, 16 mole % HAdMA and 47 mole % NLM, and 10% terpolymer EtAdMA/HAdMA/NLM consisting of 35 mole % EtAdMA, 10 mole % HAdMA and 55 mole % NLM was dissolved in 70/30 wt % PGMEA/Cyclohexanone co-solvent with 4 wt % TPSN, 0.21 wt % bockbim and 0.59 wt % of NBC-101 (all wt. % relative to total polymer weight) to make a solution with 4.3 wt % of solid content. The resulting solution was filtered through a 0.2 μm filter. The resist was spin coated onto a 12" silicon wafer which had a 42 nm thickness coating of Rohm and Haas AR40A. The resist was post-applying baked (PAB) at about 110° C. for about 60 seconds and exposed to 193 nm wavelength light on an ASML stepper (1.2 NA, 30° Quasar illumination with 0.85 outer and 0.6 inner σ annular illumination). The wafer was then post-exposure baked (PEB) at about 120° C. for about 60 seconds. The coated wafer was then developed using a single puddle develop process for about 30 seconds with 0.263 N TMAH developer (Moses Lake's AD-10). Under these process conditions, the 35 nm lines on a 140 nm pitch were resolved. The wafer was then post-developing baked (PDB) at about 200° C. for about 90 seconds.

A JSR AM2073J resist was then spin coated on the above coated developed wafer. The resist was PAB at about 110° C. for about 60 seconds and exposed to 193 nm wavelength light on an ASML stepper (1.2 NA, 30° Quarsar illumination with 0.85 outer and 0.6 inner σ annular illumination). During the exposure, the reticle was shifted so that the same set of 35 nm lines can be printed in between the $1^{st}$ layer of resist. The wafer was then PEB at about 120° C. for about 60 seconds. The coated wafer was developed using a single puddle develop process for about 30 seconds with 0.263 N TMAH developer (Moses Lake's AD-10). Under these process conditions, the 35 nm line from the $2^{nd}$ resist was printed in between another 35 nm line from the $1^{st}$ resist to form a 35 nm line and space on a 70 nm pitch.

EXAMPLE 8

Synthesis of
N-9H-fluoren-9-ylmethoxycarbonyl-4-piperidine
(FCP)

To 9-fluorenylmethyl chloroformate (2.58 g, 1o mmol) in 50 mL of methylene chloride was added piperidine (1.7 g, 20 mmol) dropwise at 0° C. The resulting mixture was stirred at 0° C. for 1 hour before it was stirred at room temperature overnight. The mixture was then filtered through Celite and washed with 50 mL of methylene chloride. The resulting organic layer was washed by 100 mL of water, 100 mL of 5% HCl aq., and 100 mL of saturated brine subsequently. The organic layer was dried over $MgSO_4$ and solvent was removed by evaporation. The final product was dried under vacuum and thus afford 2.3 gram of product as white solid (75%). 1HNMR: 7.80 (2H, d, 7.6 Hz), 7.62 (2H, d, 7.2 Hz), 7.43 (2H, t, 7.6 Hz), 7.34 (2H, t, 7.2 Hz), 4.42 (2H, d, 6.8 Hz), 4.30 (1H, t, 7.2 Hz), 3.48 (4H, t, 5.6H), 1.68-1.51 (6H, br).

EXAMPLE 9

Synthesis of 1,3-bis(N-9H-fluoren-9-ylmethoxycarbonyl-4-piperidyl)propane (DFC)

To 9-fluorenylmethyl chloroformate (2.58 g, 10 mmol) in 50 mL of methylene chloride was added 1,3-di-piperidylpropane (2.1 g, 10 mmol) dropwise at 0° C. The resulting mixture was stirred at 0° C. for 1 hour before it was stirred at room temperature overnight. The mixture was then filtered through Celite and washed with 50 mL of methylene chloride. The resulting organic layer was washed by 100 mL of water, 100 mL of 5% HCl aq., and 100 mL of saturated brine subsequently. The organic layer was dried over $MgSO_4$ and solvent was removed by evaporation. The final product was re-crystallized by ethanol and dried under vacuum and thus afford 2.0 gram of product as white solid (60%). 1HNMR: 7.80 (4H, d, 7.2 Hz), 7.62 (4H, d, 7.6 Hz), 7.43 (4H, t, 7.6 Hz), 7.34 (4H, t, 7.2 Hz), 4.44 (4H, d, 6.0 Hz), 4.28 (2H, t, 7.2 Hz), 4.25-4.04 (4H, br), 2.90-2.70 (4H, br), 1.71 (4H, br), 1.50-1.30 (4H, br), 1.30-1.20 (4H, br), 1.20-1.00 (4H, br).

EXAMPLE 10

A tetrapolymer (MAdMA/MCpMAHAdMA/NLM) consisting of 40 mole % MAdMA, 10 mole % MCpMA, 15 mole % HAdMA and 35 mole % NLM dissolved in PGMEA solvent was used to formulate (1) with 7 wt % BPIN, 0.6 wt % bockbim and 0.7 wt % of NBC-101 (all wt % relative to polymer) to make a solution with 2.5 wt % of solid content to form resist A, (2) with 7 wt % BPIN, 0.6 wt % bockbim and 1.7 wt % of DFC (all wt % relative to polymer) to make a solution with 2.5 wt % of solid content to form resist B and (3) with 7 wt % BPIN, 0.6 wt % bockbim and 4.6 wt % of DFC (all wt % relative to polymer) to make a solution with 2.5 wt % of solid content to form resist C. The resulting solutions were filtered through a 0.2 μm filter. The resists were spin coated onto a 12" silicon wafer which had a 35 nm thickness coating of Shin Etsu SHA940 and 135 nm thickness coating of JSR HM8006. The resists were post-applying baked (PAB) at about 110° C. for about 60 seconds and exposed to 193 nm wavelength light on an ASML stepper (1.2 NA, 90° Dipole illumination with 0.72 outer and 0.587 inner σ). The wafers were then post-exposure baked (PEB) at about 130° C. for about 60 seconds. The coated wafers were developed using a single puddle develop process for about 30 seconds with 0.263 N TMAH developer (Moses Lake's AD-10). Under these process conditions, the 32.5 nm lines on a 130 nm pitch were resolved. The wafers were then post-developing baked (PDB) at about 200° C. for about 90 seconds.

A JSR AM2073J resist was then spin coated onto the above coated and developed wafers. The resists were PAB at about 110° C. for about 60 seconds and exposed to 193 nm wavelength light on an ASML stepper (1.2 NA, 90° dipole illumination with 0.72 outer and 0.587 inner σ annular illumination). During the exposure, the reticle was shifted so that the same set of 32.5 nm lines can be printed in between the first layer of resist. The wafers were then PEB at about 120° C. for about 60 seconds. There were developed using a single puddle develop process for about 30 seconds with 0.263 N TMAH developer (Moses Lake's AD-10).

Under these process conditions, the 32.5 nm line from the 2nd resist was printed in between another 32.5 nm line from the first resist to form a 32.5 nm lines and spaces on a 65 nm pitch for resist B and C. For Resist A, the second layer lines standing while the first layer lines disappeared. The thermal decomposition onset temperatures are 203° C. and less than 165° C. for NBC-101 and DFC respectively. At PDB temperature of 200° C., only DFC will release the thermal base resulting in de-sensitization effect for resist B and C but not for resist A. The dose to size for resist B and resist C are the same irrespective of the loading of DFC.

The foregoing description of the embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention.

The invention claimed is:

1. A resist composition, comprising:
   a polymer comprising first repeating units containing a lactone moiety, said polymer having the properties of being substantially soluble in a first solvent and becoming substantially insoluble in said first solvent after heating said polymer to a first temperature;
   a thermal base generator capable of releasing a base upon heating said thermal base generator above a second temperature, said thermal base generator is selected from the group consisting of (i) structure:

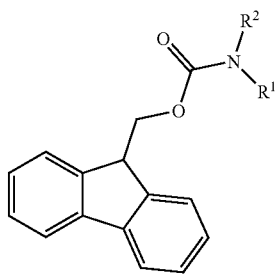

wherein each R¹ or R² is independently selected from the group consisting of a hydrogen atom, a linear alkyl, a branched alkyl, a cycloalkyl, a halogenated linear alkyl, a halogenated branched alkyl, a halogenated cycloalkyl, an aryl, a halogenated aryl, and combinations thereof, and (ii) dimers of said structure (i);
   a photosensitive acid generator capable of releasing acid upon exposure to radiation; and
   wherein said polymer consists of elements selected from the group consisting of C, N, O, H, F, S and combinations thereof.

2. The resist composition of claim 1, wherein said first repeating units are selected from the group consisting of

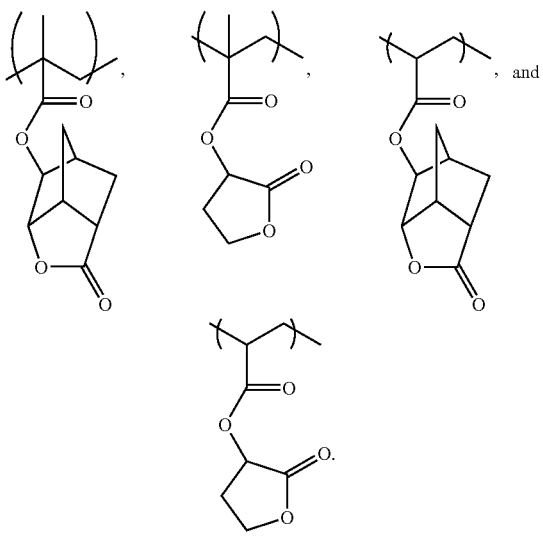

3. The resist composition of claim 1, wherein said polymer further comprises second repeating units having at least one acid labile moiety.

4. The resist composition of claim 3, wherein said at least one acid labile moiety comprises at least one tertiary ester moiety.

5. The resist composition of claim 4, wherein said at least one tertiary ester moiety is selected from the group consisting of esters of methyladamantane, esters of ethyladamantane, esters of methylcyclopentane, esters of ethylcyclopentane, esters of methylcyohexane, esters of ethylcycohexane, esters of methylcycloheptane, esters of ethylcyclohepatane, esters of methylcyclooctane, esters of ethylcyclooctane, and esters of t-butyl groups.

6. The resist composition of claim 3, wherein said polymer further comprises third repeating units having a moiety selected from the group consisting of alkyl alcohol groups and carboxylic acid groups.

7. The resist composition of claim 6, wherein said polymer further comprises fourth repeating units having a moiety selected from the group consisting of sulfonamides, fluorinated sulfonamides, fluoroalcohols, dicarboxyimides, N-hydroxy dicarboxyimides, phenol, naphthol, amino and imino groups.

8. The method of claim 1, wherein said first temperature is about 140° C. or greater.

9. The resist composition of claim 1, further including:
   a casting solvent or a casting solvent and one or more of a surfactant, a base quencher and a sensitizer.

10. The resist composition of claim 1, wherein said polymer is selected from the group consisting of:
    a copolymer of repeating units

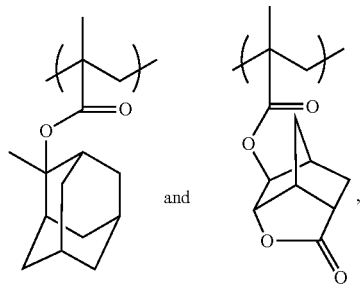

23
terpolymer of repeating units
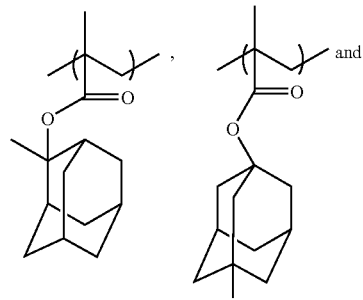
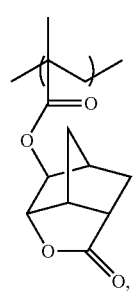
a terpolymer of repeating units
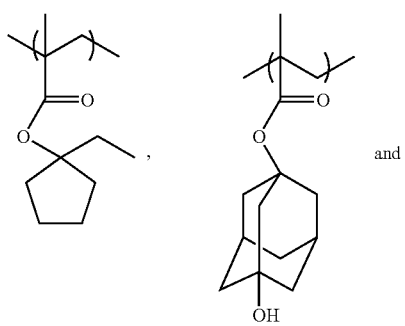
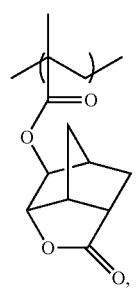
24
a terpolymer of repeating units
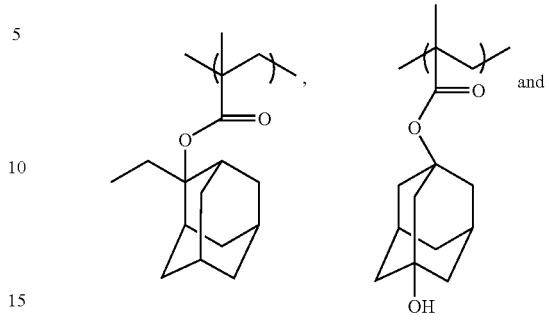
a terpolymer of repeating units
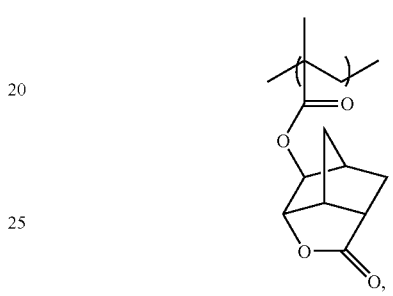
a tetrapolymer of repeating units
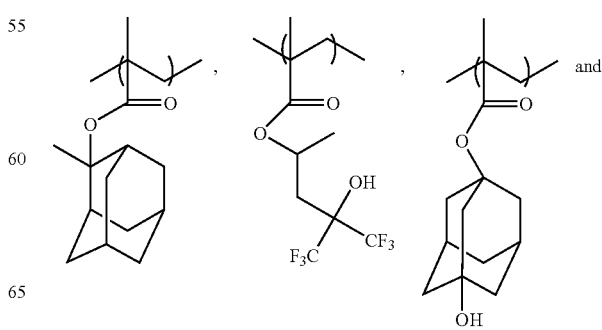

-continued

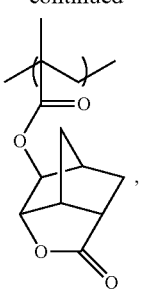

a tetrapolymer of repeating units

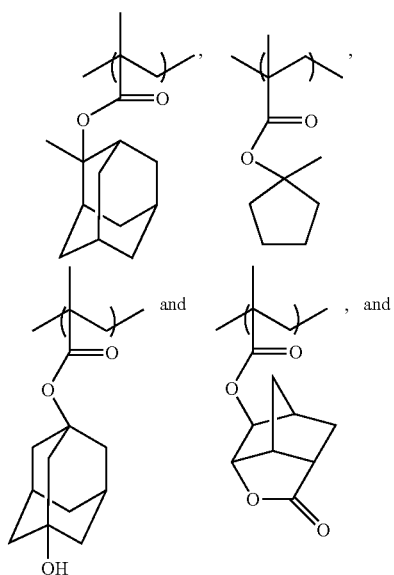

a tetrapolymer of repeating units

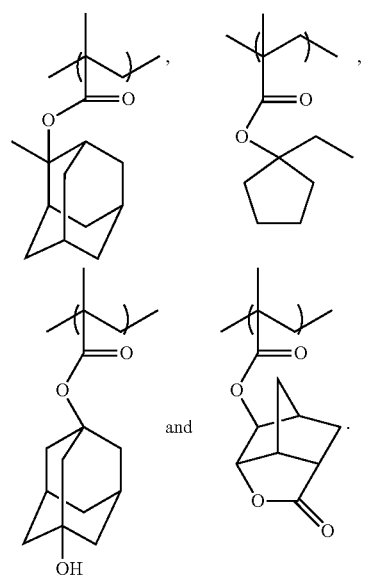

11. A method comprising:
forming a first film of a first photoresist on a substrate, said first photoresist comprising a first polymer, a thermal base generator capable of releasing a base above a first temperature, a first photosensitive acid generator capable of generating an acid upon exposure to radiation, and a first solvent, said first photoresist having the properties of being substantially soluble in said solvent and becoming substantially insoluble in said solvent after heating said first photoresist to above a second temperature;

patternwise imaging said first film through a first mask, said imaging comprising exposing at least one region of said first film to radiation, resulting in producing a first acid catalyst in said at least one exposed region of said first film;

after said imaging, developing said first film in an aqueous base, resulting in removing base-soluble exposed regions of said first film and forming a first patterned layer of said first film; and baking said first patterned layer above said first temperature and above said second temperature, wherein resulting from said baking said first thermal base generator releases a base within said first patterned layer, wherein resulting from said baking said first patterned layer becomes substantially insoluble in said first solvent;

wherein said thermal base generator capable of releasing a base upon heating said thermal base generator above a second temperature, said thermal base generator is selected from the group consisting of (i) structure:

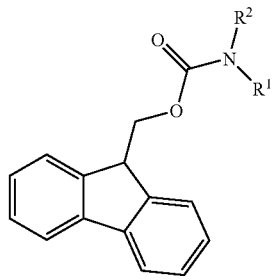

wherein each $R^1$ or $R^2$ is independently selected from the group consisting of a hydrogen atom, a linear alkyl, a branched alkyl, a cycloalkyl, a halogenated linear alkyl, a halogenated branched alkyl, a halogenated cycloalkyl, an aryl, a halogenated aryl, and combinations thereof, and (ii) dimers of said structure (i); and wherein said polymer consists of elements selected from the group consisting of C, N, O, H, F, S and combinations thereof.

12. The method of claim 11, further comprising:
after said baking, forming a second film of a second photoresist over said first patterned layer, said second photoresist comprising a second polymer and a second photosensitive acid generator;

patternwise imaging simultaneously said first patterned layer and said second film through a second mask, said simultaneous imaging exposing at least one region of said second film to radiation and resulting in producing a second acid catalyst in said at least one exposed region of said second film, wherein acid catalyst is produced in said first patterned layer and said base neutralizes said acid catalyst in said first patterned layer; and developing said second film, resulting in removing regions of said second film and forming a second patterned layer of said second film.

13. The method of claim 11, further comprising after said patternwise imaging said first film and before said developing said first film, baking said first film at a third temperature between about 80° C. and about 150° C.

14. The method of claim 11, wherein said first temperature and said second temperature are each independently between about 140° C. and about 260° C.

15. The method of claim 12, wherein said first polymer and said second polymer are different.

16. The method of claim 11, wherein said first polymer comprises first repeating units selected from the group consisting of:

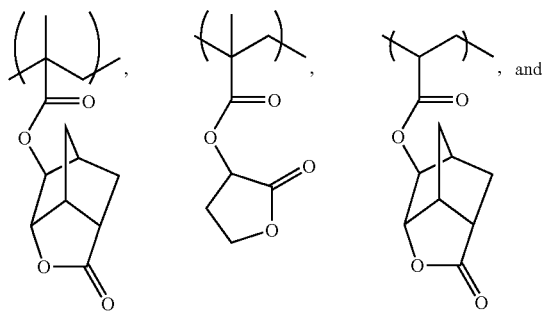

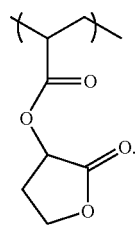

17. The method of claim 16, wherein said polymer further comprises second repeating units having at least one tertiary ester moiety, wherein said at least one tertiary ester moiety is selected from the group consisting of esters of methyladamantane, esters of ethyladamantane, esters of methylcyclopentane, esters of ethylcyclopentane, esters of methylcyohexane, esters of ethylcycohexane, esters of methylcycloheptane, esters of ethylcyclohepatane, esters of methylcyclooctane, esters of ethylcyclooctane, and esters of t-butyl groups.

18. The method of claim 17, wherein said polymer further comprises third repeating units having at least one alkylalcohol or at least one carboxylic acid moiety.

19. The method of claim 18, wherein said third repeating units are selected from the group consisting of

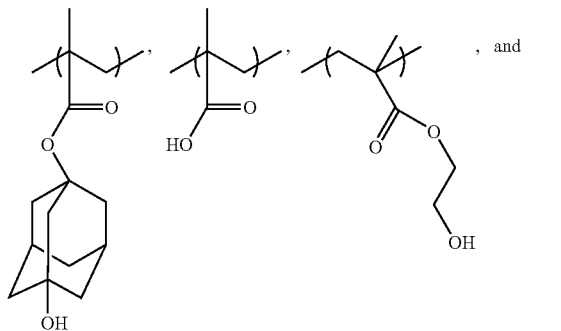

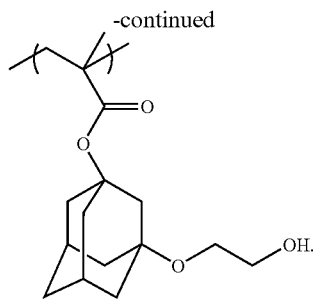

20. The method of claim 18, wherein said polymer further comprises fourth repeating units having a moiety selected from the group consisting of sulfonamides, fluorinated sulfonamides, fluoroalcohols, dicarboxyimides, N-hydroxy dicarboxyimides, phenol, naphthol, amino and imino groups.

21. The method of claim 11, wherein said first photoresist further comprises a casting solvent or a casting solvent and one or more of a surfactant, a base quencher and a sensitizer.

22. The method of claim 11, wherein said first polymer is selected from the group consisting of:

a copolymer of repeating units

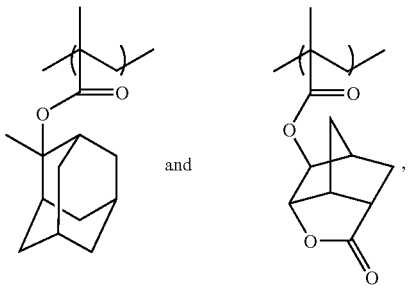

terpolymer of repeating units

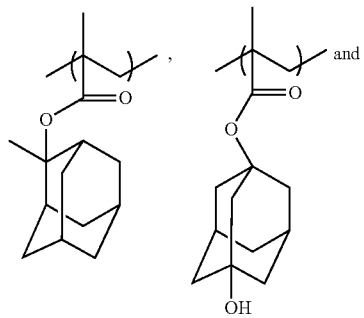

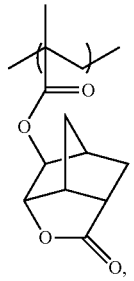

a terpolymer of repeating units
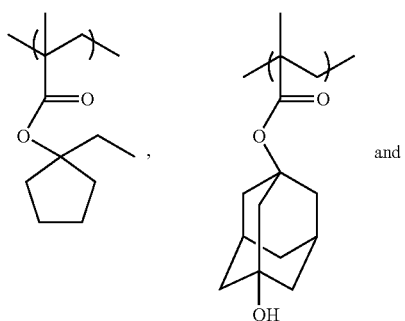
a terpolymer of repeating units
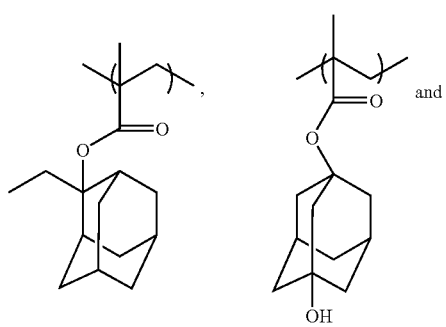
a terpolymer of repeating units
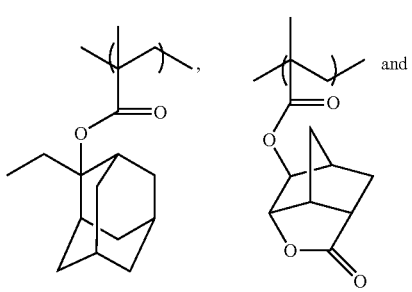
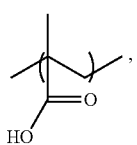
a tetrapolymer of repeating units
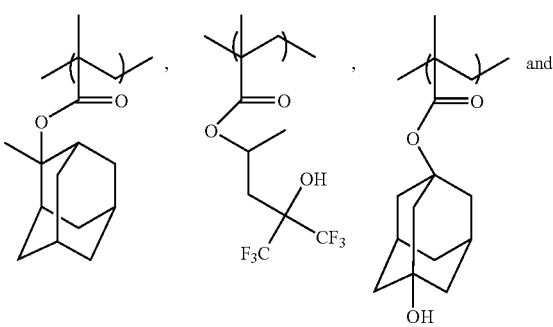
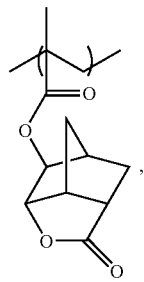
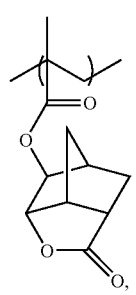
a tetrapolymer of repeating units
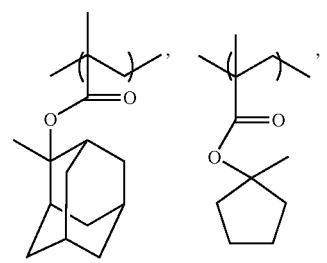
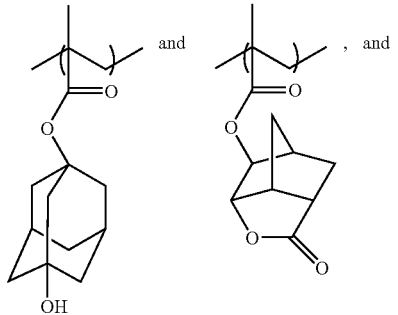

a tetrapolymer of repeating units

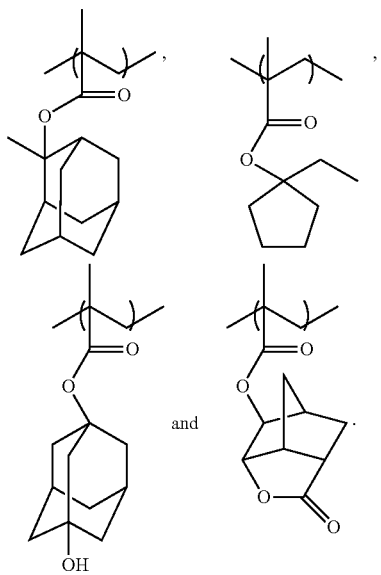

and

23. A resist composition, comprising:
one or more polymers, each polymer of said one or more polymers comprising first repeating units containing a lactone moiety, said polymer having the properties of being substantially soluble in a first solvent and becoming substantially insoluble in said first solvent after heating said polymer to a first temperature.

a thermal base generator capable of releasing a base upon heating said thermal base generator above a second temperature a thermal base generator capable of releasing a base upon heating said thermal base generator above a second temperature, said thermal base generator selected from the group consisting of (i) structure:

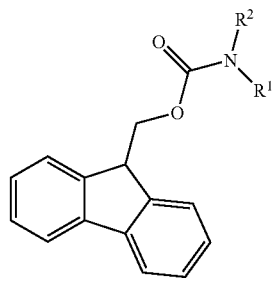

wherein each $R^1$ or $R^2$ is independently selected from the group consisting of a hydrogen atom, a linear alkyl, a branched alkyl, a cycloalkyl, a halogenated linear alkyl, a halogenated branched alkyl, a halogenated cycloalkyl, an aryl, a halogenated aryl, and combinations thereof, and (ii) dimers of said structure (i);
a photosensitive acid generator capable of releasing acid upon exposure to radiation; and
wherein each polymer of said one or more polymers consists of elements selected from the group consisting of C, N, O, H, F, S and combinations thereof.

* * * * *